United States Patent
Li et al.

(10) Patent No.: US 10,224,483 B2
(45) Date of Patent: Mar. 5, 2019

(54) CROSSLINKABLE QUANTUM DOT AND PREPARING METHOD THEREOF, ARRAY SUBSTRATE AND PREPARING METHOD THEREOF

(71) Applicant: BOE Technology Group Co., Ltd., Beijing (CN)

(72) Inventors: Yanzhao Li, Beijing (CN); Zhuo Chen, Beijing (CN); Yuedi He, Beijing (CN); Jie Sun, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 15/540,711

(22) PCT Filed: Oct. 21, 2016

(86) PCT No.: PCT/CN2016/102952
§ 371 (c)(1),
(2) Date: Jun. 29, 2017

(87) PCT Pub. No.: WO2017/121163
PCT Pub. Date: Jul. 20, 2017

(65) Prior Publication Data
US 2018/0108842 A1    Apr. 19, 2018

(30) Foreign Application Priority Data
Jan. 13, 2016    (CN) .......................... 2016 1 0021323

(51) Int. Cl.
*H01L 51/00*    (2006.01)
*G03F 7/09*    (2006.01)
(Continued)

(52) U.S. Cl.
CPC ........ *H01L 51/0018* (2013.01); *G03F 7/0007* (2013.01); *G03F 7/0047* (2013.01);
(Continued)

(58) Field of Classification Search
None
See application file for complete search history.

(56) References Cited

U.S. PATENT DOCUMENTS

| 6,251,303 B1 * | 6/2001 | Bawendi | B82Y 15/00 252/301.4 R |
|---|---|---|---|
| 9,570,549 B2 * | 2/2017 | Jang | B82Y 30/00 |
| 2008/0238299 A1 * | 10/2008 | Cho | B82Y 20/00 313/503 |
| 2008/0272347 A1 * | 11/2008 | Fukuda | C07F 9/5304 252/586 |

(Continued)

FOREIGN PATENT DOCUMENTS

| CN | 101053811 A | 10/2007 |
|---|---|---|
| CN | 103346154 A | 10/2013 |

(Continued)

OTHER PUBLICATIONS

Jan. 18, 2017—(WO) International Search Report and Written Opinion Appn PCT/CN2016/102952 with English Tran.
(Continued)

*Primary Examiner* — Joseph Schoenholtz
(74) *Attorney, Agent, or Firm* — Banner & Witcoff, Ltd.

(57) ABSTRACT

A crosslinkable quantum dot (QD) and a preparing method thereof, an array substrate made by using the crosslinkable quantum dot (QD) and a preparing method thereof are provided. The surface of the crosslinkable quantum dot has a pair of groups R1 and R2 capable of reacting to form a cross-linked network, or a group R3 capable of being cross-linked by a crosslinking agent to form a cross-linked network.

12 Claims, 4 Drawing Sheets (51) Int. Cl.
| | |
|---|---|
| *H01L 27/32* | (2006.01) |
| *G03F 7/20* | (2006.01) |
| *G03F 7/26* | (2006.01) |
| *G03F 7/16* | (2006.01) |
| *H01L 21/77* | (2017.01) |
| *H01L 27/12* | (2006.01) |
| *H01L 51/50* | (2006.01) |
| *H01L 51/52* | (2006.01) |
| *H01L 51/56* | (2006.01) |
| *G03F 7/00* | (2006.01) |
| *G03F 7/004* | (2006.01) |
| *G03F 7/105* | (2006.01) |

(52) U.S. Cl.
CPC .............. *G03F 7/094* (2013.01); *G03F 7/105* (2013.01); *G03F 7/162* (2013.01); *G03F 7/2002* (2013.01); *G03F 7/2022* (2013.01); *G03F 7/26* (2013.01); *H01L 21/77* (2013.01); *H01L 27/12* (2013.01); *H01L 27/32* (2013.01); *H01L 27/3211* (2013.01); *H01L 51/0032* (2013.01); *H01L 51/0077* (2013.01); *H01L 51/0079* (2013.01); *H01L 51/0092* (2013.01); *H01L 51/50* (2013.01); *H01L 51/52* (2013.01); *H01L 51/56* (2013.01); *H01L 51/0035* (2013.01); *H01L 51/0037* (2013.01); *H01L 51/0039* (2013.01); *H01L 51/502* (2013.01)

(56) References Cited

U.S. PATENT DOCUMENTS

| | | | | |
|---|---|---|---|---|
| 2012/0001217 | A1* | 1/2012 | Kang | C08G 75/045 |
| | | | | 257/98 |
| 2012/0195340 | A1* | 8/2012 | Cheon | H01L 33/501 |
| | | | | 372/50.1 |
| 2015/0212352 | A1* | 7/2015 | Guo | G02F 1/133617 |
| | | | | 349/71 |
| 2016/0218141 | A1 | 7/2016 | Cai | |

FOREIGN PATENT DOCUMENTS

| | | | | |
|---|---|---|---|---|
| CN | 105070849 A | 11/2015 | | |
| CN | 105098075 A | 11/2015 | | |
| CN | 105552241 A | 5/2016 | | |
| JP | WO 2016189869 A1 * | 12/2016 | ............ | C09K 11/08 |
| KR | 1020150080866 A | 7/2015 | | |
| WO | WO 2014166179 A1 * | 10/2014 | ....... | G02F 1/133617 |

OTHER PUBLICATIONS

Mar. 2, 2017—(CN) First Office Action Appn 201610021323.8 with English Tran.

Kim, et al., "Full-Colour Quantum Dot Displays Fabricated by Transfer Printing", Nature Photonics, vol. 5, Mar. 2011, pp. 176-182.

* cited by examiner

CROSSLINKABLE QUANTUM DOT AND PREPARING METHOD THEREOF, ARRAY SUBSTRATE AND PREPARING METHOD THEREOF

The application is a U.S. National Phase Entry of International Application No. PCT/CN2016/102952 filed on Oct. 21, 2016, designating the United States of America and claiming priority to Chinese Patent Application No. 201610021323.8 filed on Jan. 13, 2016. The present application claims priority to and the benefit of the above-identified applications and the above-identified applications are incorporated by reference herein in their entirety.

TECHNICAL FIELD

Embodiments of the present disclosure relate to a crosslinkable quantum dot (QD) and a preparing method thereof, an array substrate formed by the crosslinkable quantum dot (QD) and a preparing method thereof.

BACKGROUND

Active matrix organic light emitting diode (AMOLED) has been recognized as a promising display of the next generation to replace the liquid crystal display (LCD). However, with the consumers' increasing consumption level, display products with a high resolution have become prevailing. AMOLED products with a high resolution are difficult to compete with LCD, because the organic layer structures of the organic light emitting display are generally fabricated by a mask evaporation method which has problems such as malposition, low qualified rate, incapacity to emit light in a smaller area and incapacity to accurately control defects in the evaporation region, and thus fails to meet the requirement of high resolution display under rapid development. Meanwhile, the resolution of the organic light-emitting layer fabricated in a printing method rather than the mask evaporation method is extremely limited. Therefore, AMOLED products with a high resolution face serious problems of high technical difficulty, low qualified rate and high commodity price.

Quantum dots (QDs) are also called as nanocrystals, and are nanoparticles consisting of elements from Groups II-VI or Groups III-V. The particle diameter of quantum dots generally ranges from 1 nm to 20 nm. Because electrons and holes are subjected to quantum confinement, a continuous band structure changes into a discrete band structure and QDs may emit fluorescence after being excited.

With the development of quantum dot technologies, in-depth research on electroluminescent quantum dot light emitting diodes has been conducted. Quantum efficiency is increasingly improved and has basically reached an industrialization level. Further adopting new processes and technologies to realize industrialization has become a future trend. In prior arts, in order to improve the resolution of an OLED, line width in a mask process is required to be reduced for an OLED evaporation mask, and a higher precision print nozzle is required. Such requirements are difficult to be met in a mass production process. Accordingly, there is a need for a method for preparing quantum dot light emitting diodes in a large scale which may realize a high resolution, enhance the qualified rate and improve the utilization rate of quantum dots.

SUMMARY

Embodiments of the present disclosure relate to a crosslinkable quantum dot and a preparing method thereof, and further embodiments of the present disclosure relate to an array substrate made using the crosslinkable quantum dot and a method for preparing the array substrate in a patterning process such as a photolithography process.

At least one embodiment of the present disclosure provides a crosslinkable quantum dot, wherein the surface of the crosslinkable quantum dot has one of a pair of groups R1 and R2 capable of reacting to form a cross-linked network, and a group R3 capable of being cross-linked by a cross-linking agent to form a cross-linked network.

For example, a quantum dot material for preparing the crosslinkable quantum dot is selected from at least one of CdS, CdSe, ZnSe, InP, PbS, $CsPbCl_3$, $CsPbBr_3$, $CsPhI_3$, CdS/ZnS, CdSe/ZnS, ZnSe, InP/ZnS, PbS/ZnS, $CsPbCl_3$/ZnS, $CsPbBr_3$/ZnS and $CsPhI_3$/ZnS.

For example, the group R1 is selected from at least one of mercapto, alkenyl and dialkylene; and the group R2 which is the counterpart of the group R1 is selected from at least one of alkenyl, dialkylene, alkynyl and dialkynyl.

For example, the group R3 is selected from at least one of mercapto, alkenyl and dialkylene, and the crosslinking agent is selected from at least one of C4-C20 dialkene or C4-C20 dialkyne.

At least one embodiment of the present disclosure further provides a method for preparing a crosslinkable quantum dot, and the method comprises:

step 1: bringing a quantum dot material into contact with pyridine to obtain a quantum dot having pyridine on its surface; and step 2: bringing a quantum dot having pyridine on its surface into contact with a crosslinking ligand material to obtain the crosslinkable quantum dot, wherein the crosslinking ligand material comprises at least one of a ligand having the groups R1 and R2, and a ligand having the group R3.

For example, in step 1, the quantum dot material and pyridine at a weight ratio greater than 1:1 are kept in contact for about 5 minutes to 10 hours with stirring at room temperature and under normal pressure, and then the quantum dot having pyridine on its surface is separated by a centrifugal method.

For example, the ligand having the groups R1 and R2 comprises tert-butoxycarbonyl protected C-methyl calixarene [4] and diphenyliodanium 9,10-dimethoxy anthracene-2-sulfonate having carboxyl to obtain the crosslinkable quantum dot which is sensitive to I-line.

For example, the ligand having the groups R1 and R2 comprises G novolak and diazonaphthoquinone having carboxyl to obtain a crosslinkable quantum dot which is sensitive to G-line.

For example, the ligand having the groups R1 and R2 comprises H novolak and diazonaphthoquinone having carboxyl to obtain a crosslinkable quantum dot which is sensitive to H-line.

For example, the group R1 is selected from at least one of mercapto, alkenyl and dialkylene; the group R2 which is the counterpart of the group R1 is selected from at least one of alkenyl, dialkylene, alkynyl and dialkynyl, so that the obtained crosslinkable quantum dot is sensitive to ultraviolet.

At least one embodiment of the present disclosure further provides an array substrate, comprising: a base substrate and a plurality of light emitting sub-pixels arranged on the base substrate, wherein each of the light emitting sub-pixels comprises a first electrode, a quantum dot light-emitting layer and a second electrode which are arranged sequentially on the base substrate, and the quantum dot light-emitting layer comprises a cross-linked network formed by the crosslinkable quantum dot.

For example, the surface of the crosslinkable quantum dot has a pair of groups R1 and R2 capable of reacting to form a cross-linked network, and the cross-linked network is formed by crosslinking the crosslinkable quantum dot.

For example, the surface of the crosslinkable quantum dot has a group R3 capable of being cross-linked by a crosslinking agent to form a cross-linked network, and the cross-linked network is formed by crosslinking reaction between the crosslinkable quantum dot and the crosslinking agent.

For example, the group R3 is selected from at least one of mercapto, alkenyl and dialkylene, and the crosslinking agent is selected from at least one of C4-C20 dialkene or C4-C20 dialkyne.

At least one embodiment of the present disclosure further provides a display device comprising the array substrate described above.

At least one embodiment of the present disclosure further provides a method for preparing an array substrate, and the method comprises:

forming a layer comprising the crosslinkable quantum dot described above on a base substrate; and patterning the layer to obtain a quantum dot light-emitting layer corresponding to a plurality of light emitting sub-pixels, wherein the quantum dot light-emitting layer comprises the cross-linked network formed by the crosslinkable quantum dot.

For example, the layer comprising the crosslinkable quantum dot is exposed through a mask, and then is developed, thereby forming the quantum dot light-emitting layer of the light emitting sub-pixel.

For example, if the crosslinkable quantum dot comprises a green light quantum dot sensitive to a first monochromatic light, then the layer comprising the crosslinkable quantum dot may be exposed to the first monochromatic light; if the crosslinkable quantum dot comprises a blue light quantum dot sensitive to a second monochromatic light, then the layer comprising the crosslinkable quantum dot may be exposed to the second monochromatic light; if the crosslinkable quantum dot comprises a red light quantum dot sensitive to a third monochromatic light, then the layer comprising the crosslinkable quantum dot may be exposed to the third monochromatic light.

For example, the method comprises at least two of the following operations:

forming a layer comprising the crosslinkable quantum dot described above on a base substrate wherein the crosslinkable quantum dot comprises a green light quantum dot sensitive to a first monochromatic light, exposing the layer to the first monochromatic light through a first mask that has a contrary pattern to a green light emitting sub-pixel, and then developing the exposed layer to form a green light emitting sub-pixel pattern;

forming a layer comprising the crosslinkable quantum dot described above on a base substrate wherein the crosslinkable quantum dot comprises a blue light quantum dot sensitive to a second monochromatic light, exposing the layer to the second monochromatic light through a second mask that has a contrary pattern to a blue light emitting sub-pixel, and then developing the exposed layer to form a blue light emitting sub-pixel pattern;

forming a layer comprising the crosslinkable quantum dot described above on a base substrate wherein the crosslinkable quantum dot comprises a red light quantum dot sensitive to a third monochromatic light, exposing the layer to the third monochromatic light through a third mask that has a contrary pattern to a red light emitting sub-pixel, and then developing the exposed layer to form a red light emitting sub-pixel pattern.

For example, in the above methods, the first monochromatic light is I-line; the second monochromatic light is G-line; and the third monochromatic light is H-line.

BRIEF DESCRIPTION OF THE DRAWINGS

In order to clearly illustrate the technical solution of the embodiments of the disclosure, the drawings of the embodiments will be briefly described. It is obvious that the described drawings are only related to some embodiments of the disclosure and thus are not limitative of the disclosure.

FIGS. 3-1 to 3-11 are flow charts of preparing sub-pixel patterns from each of three layers of quantum dots in red, green or blue by photolithography respectively;

FIGS. 4-1 to 4-7 are flow charts of preparing sub-pixel patterns by applying three layers of quantum dots in red, green or blue together and then being subjected to three separate photolithography processes; and FIG. 5 is a schematic flat structure diagram of an array substrate provided by an embodiment of the present disclosure.

REFERENCE NUMERALS

101—base substrate; 102—first electrode; 103—first quantum dot layer; 1031—green light emitting sub-pixel pattern; 104—first mask; 105—first monochromatic light; 107—second quantum dot layer; 1071—blue light emitting sub-pixel pattern; 108—second monochromatic light; 109—third quantum dot layer; 1091—red light emitting sub-pixel pattern; 110—third monochromatic light; 112—second electrode; 113—insulating material; 114—second mask; 115—third mask; 125—ultraviolet; and 203—fourth quantum dot layer.

DETAILED DESCRIPTION

In order to make objects, technical details and advantages of the embodiments of the disclosure apparent, the embodiments will be described in a clearly and fully understandable way in connection with the drawings. It is obvious that the described embodiments are just a part but not all of the embodiments of the disclosure. Based on the described embodiments herein, those skilled in the art can obtain other embodiment(s), without any inventive work, which should be within the scope of the present invention.

It should be noted that, in a case of describing a crosslinkable quantum dot in the present disclosure, the term "sensitive to a first monochromatic light" herein means that the first monochromatic light can make the crosslinkable quantum dots to be crosslinked. Similarly, the term "sensitive to a second monochromatic light" means that the second monochromatic light can make the crosslinkable quantum dots to be crosslinked. Similarly, the term "sensitive to a third monochromatic light" means that the third monochromatic light can make the crosslinkable quantum dots to be crosslinked. The term "monochromatic light" in the present disclosure means that light has a wavelength within a very narrow wavelength range (such as a wavelength range having a wavelength span not more than 20 nm or not more than 10 nm). For example, the monochromatic light may be light having a unitary wavelength. Generally, the monochromatic light may be within the range of ultraviolet and visible light.

The term "sensitive to ultraviolet" means that groups on the surface of the crosslinkable quantum dot can perform a crosslinking reaction, such as a click reaction, under ultraviolet.

In one aspect, at least one embodiment of the present disclosure provides a crosslinkable quantum dot, wherein the surface of the crosslinkable quantum dot has a pair of groups R1 and R2 capable of reacting to form a cross-linked network, or a group R3 capable of being cross-linked by a crosslinking agent to form a cross-linked network.

Figure 1:
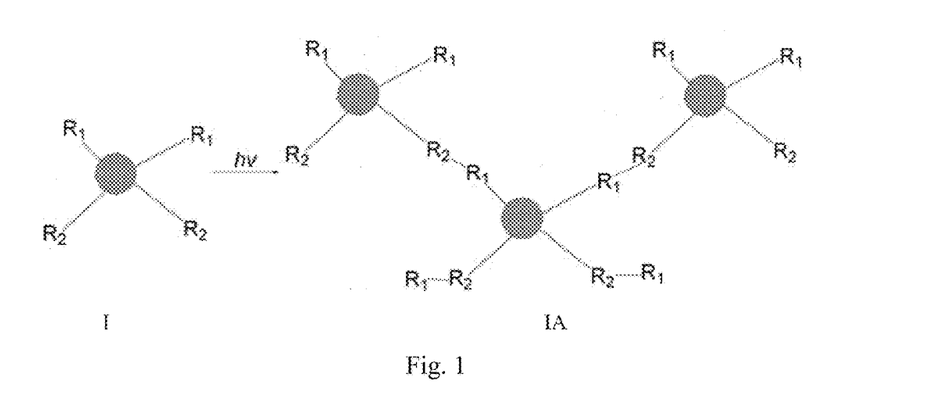
FIG. 1 is a schematic diagram of a crosslinking reaction of crosslinkable quantum dots.

For a crosslinkable quantum dot that has a pair of groups R1 and R2 capable of reacting to form a cross-linked network, FIG. 1 illustrates the principle of the crosslinking reaction of the crosslinkable quantum dots. In FIG. 1, a crosslinkable quantum dot (shown as formula I) that has a pair of groups R1 and R2 capable of reacting to form a cross-linked network is exposed to light (hv) thereby forming a cross-linked network IA among the crosslinkable quantum dots.

Figure 2:
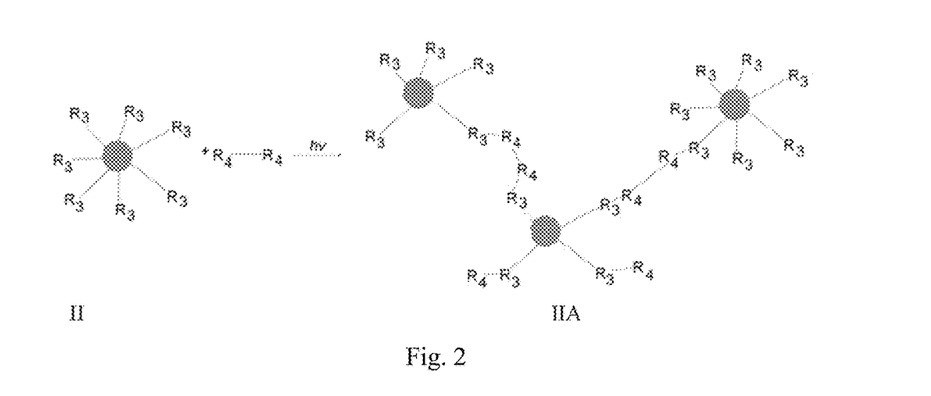
FIG. 2 is another schematic diagram of a crosslinking reaction of crosslinkable quantum dots.

For a crosslinkable quantum dot that has a group R3 capable of being cross-linked by a crosslinking agent to form a cross-linked network, FIG. 2 illustrated the principle of the crosslinking reaction of the crosslinkable quantum dots. In FIG. 2, a crosslinkable quantum dot (shown as formula II) that has a group of R3 capable of being cross-linked by a crosslinking agent to form a cross-linked network, and a crosslinking agent (shown as R4-R4) are exposed to light (hv), thereby forming a cross-linked network IIA by reacting the crosslinkable quantum dot with the crosslinking agent.

In some embodiments, a quantum dot material for preparing the crosslinkable quantum dot is selected from at least one of CdS, CdSe, ZnSe, InP, PbS, $CsPbCl_3$, $CsPbBr_3$, $CsPhI_3$, CdS/ZnS, CdSe/ZnS, ZnSe, InP/ZnS, PbS/ZnS, $CsPbCl_3$/ZnS, $CsPbBr_3$/ZnS, and $CsPhI_3$/ZnS.

In some embodiments, the group R1 is selected from at least one of mercapto, alkenyl and dialkylene; and the group R2 which is the counterpart of the group R1 is selected from at least one of alkenyl, dialkylene, alkynyl and dialkynyl.

In some embodiments, the group R3 is selected from at least one of mercapto, alkenyl and dialkylene, and the crosslinking agent is selected from at least one of C4-C20 dialkene (such as, 1,7-octadiene, isoprene, 1,3-butadiene) or C4-C20 dialkyne (such as 1,9-octadiyne).

In some embodiments, the crosslinkable quantum dot comprises at least one of red light quantum dots, green light quantum dots and blue light quantum dots.

In some embodiments, the crosslinkable quantum dot is light-sensitive, for example, the crosslinkable quantum dot is sensitive to ultraviolet. Since a crosslinking reaction can occur after exposing the crosslinkable quantum dot to a specific light, the crosslinkable quantum dot is light-sensitive. However, the crosslinkable quantum dot may also be thermal-sensitive. That is to say, a crosslinking reaction may occur after heating the crosslinkable quantum dot to a certain temperature (such as 60° C. or 100° C.).

In some embodiments, the crosslinkable quantum dot is sensitive to a monochromatic light. In a case that a crosslinkable quantum dot is sensitive to a monochromatic light, a crosslinking reaction would occur if the crosslinkable quantum dot is exposed to the monochromatic light. As such, the crosslinking reaction of the crosslinkable quantum dot is easy to be controlled, and unexpected crosslinking reactions would not occur if the crosslinkable quantum dot is exposed to light having a longer or shorter wavelength.

By selecting the types of functional groups on the surface of the crosslinkable quantum dot, the crosslinkable quantum dot that emits light in different colors can be made sensitive to different monochromatic lights.

In some embodiments, the crosslinkable quantum dot is a green light quantum dot sensitive to I-line. The green light quantum dot may be obtained by making the surface of a green quantum dot material to have the following ligands: tert-butoxycarbonyl protected C-methyl calixarene [4] and diphenyliodanium 9,10-dimethoxy anthracene-2-sulfonate having carboxyl.

In some embodiments, the crosslinkable quantum dot is a blue light quantum dot sensitive to G-line. The blue light quantum dot may be obtained by making the surface of a blue quantum dot material to have the following ligands: G novolak and diazonaphthoquinone having carboxyl.

In some embodiments, the crosslinkable quantum dot is a red light quantum dot sensitive to H-line. The red light quantum dot may be obtained by making the surface of a red quantum dot material to have the following ligands: H novolak and diazonaphthoquinone having carboxyl.

At least one embodiment of the present disclosure further provides a method for preparing a crosslinkable quantum dot, and the method comprises the following steps:

step 1: bringing a quantum dot material into contact with pyridine (as solvent) to obtain a quantum dot having pyridine (as ligand) on its surface;

step 2: bringing the quantum dot having pyridine on its surface into contact with a crosslinking ligand material to obtain the crosslinkable quantum dot, wherein the crosslinking ligand material comprises at least one of a ligand having the groups R1 and R2 and a ligand having the group R3.

In some embodiments, step 1 is performed as follows.

The quantum dot material and pyridine (as solvent) at a weight ratio greater than 1:1 are kept in contact for about 5 minutes to 10 hours with stirring at room temperature and under normal pressure, then the quantum dot having pyridine on its surface is separated by a centrifugal method.

In some embodiments, the quantum dot material has at least one ligand selected from tri-n-octylphosphine, tri-n-octylphosphine oxide, oleylamine and oleic acid.

In some embodiments, the quantum dot material comprises at least one selected from the red light quantum dot material, the green light quantum dot material and the blue light quantum dot material.

In the present disclosure, the term "red quantum dot (material)" and the term "red light quantum dot (material)" have a same meaning, and both mean a quantum dot (material) that can emit red light upon being excited.

In the present disclosure, the term "green quantum dot (material)" and the term "green light quantum dot (material)" have a same meaning, and both mean a quantum dot (material) that can emit green light upon being excited.

In the present disclosure, the term "blue quantum dot (material)" and the term "blue light quantum dot (material)" have a same meaning, and both mean a quantum dot (material) that can emit blue light upon being excited.

In the present disclosure, the term "a quantum dot light-emitting layer" means a light-emitting layer comprising quantum dots.

In some embodiments, the ligand having the groups R1 and R2 comprises tert-butoxycarbonyl protected C-methyl calixarene [4] and diphenyliodanium 9,10-dimethoxyanthracene-2-sulfonate having carboxyl, so that the obtained crosslinkable quantum dot is sensitive to I-line.

In some embodiments, the ligand having the groups R1 and R2 comprises G novolak and diazonaphthoquinone having carboxyl, so that the obtained crosslinkable quantum dot is sensitive to G-line.

In some embodiments, the ligand having the groups R1 and R2 comprises H novolak and diazonaphthoquinone having carboxyl, so that the obtained crosslinkable quantum dot is sensitive to H-line.

In some embodiments, the group R1 is selected from at least one of mercapto, alkenyl and dialkylene; and the group R2 which is the counterpart of the group R1 is selected from at least one of alkenyl, dialkylene, alkynyl and dialkynyl, so that the obtained crosslinkable quantum dot is sensitive to ultraviolet.

At least one embodiment of the present disclosure further provides an array substrate, and the array substrate comprises a base substrate and a plurality of light emitting sub-pixels arranged on the base substrate, wherein each of the light emitting sub-pixels comprises a first electrode, a quantum dot light-emitting layer and a second electrode which are arranged sequentially on the base substrate, and the quantum dot light-emitting layer comprises a cross-linked network formed by the crosslinkable quantum dot described above.

In some embodiments, the first electrode is an anode; the second electrode is a cathode; each of the light emitting sub-pixels further comprises a hole injection layer and a hole transporting layer arranged between the first electrode and the quantum dot light-emitting layer; the light emitting sub-pixels also comprise an electron injection layer and an electron transporting layer arranged between the second electrode and the quantum dot light-emitting layer.

In some embodiments, the first electrode is a cathode; the second electrode is an anode; each of the light emitting sub-pixels further comprises a hole injection layer and a hole transporting layer arranged between the second electrode and the quantum dot light-emitting layer; the light emitting sub-pixels also comprise an electron injection layer and an electron transporting layer arranged between the first electrode and the quantum dot light-emitting layer.

In some embodiments, the surface of the crosslinkable quantum dot has a pair of groups R1 and R2 capable of reacting to form a cross-linked network, and the cross-linked network is formed by crosslinking the crosslinkable quantum dot.

In some embodiments, the surface of the crosslinkable quantum dot has a group R3 capable of being cross-linked by a crosslinking agent to form a cross-linked network, and the cross-linked network is formed by crosslinking reaction between the crosslinkable quantum dot and the crosslinking agent.

In some embodiments, the group R3 is selected from at least one of mercapto, alkenyl and dialkylene, and the crosslinking agent is selected form at least one of C4-C20 dialkene (such as, 1,7-octadiene, isoprene, 1,3-butadiene) or C4-C20 dialkyne (such as 1,9-octadiyne).

In some embodiments, the width of each light emitting sub-pixel ranges from about 10 micrometers to about 30 micrometers, and the length of each light emitting sub-pixel ranges from about 50 micrometers to about 100 micrometers.

In some embodiments, the area of each light emitting sub-pixel ranges from about 500 to about 3000 square micrometers.

At least one embodiment of the present disclosure further provides a display panel or a display device comprising the array substrate described above.

At least one embodiment of the present disclosure further provides a method for preparing an array substrate or a display panel or a display device, and the method comprises:

step A: forming a layer comprising the crosslinkable quantum dot on a base substrate, and preparing a quantum dot light-emitting layer corresponding to a plurality of light emitting sub-pixels through a photolithography process, wherein the quantum dot light-emitting layer comprises the cross-linked network formed by the crosslinkable quantum dot.

Figure 33:
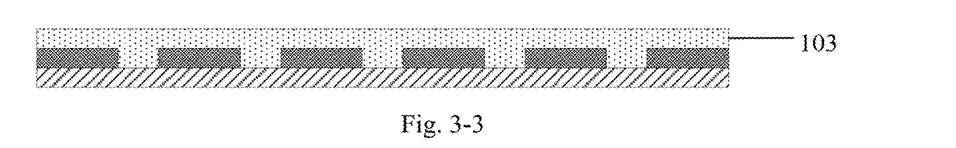
Figure 34:
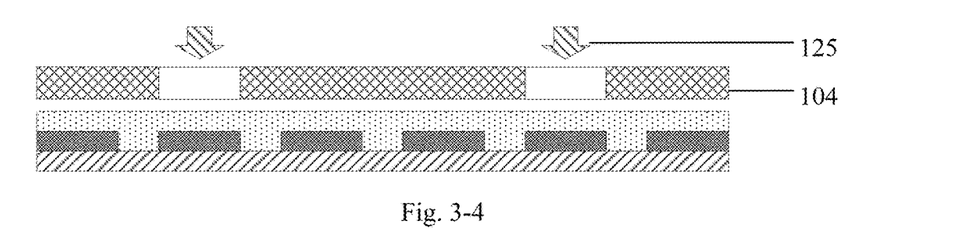
Figure 35:
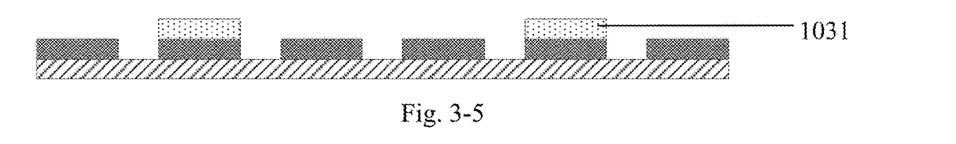

FIG. 3-3 to FIG. 3-5 illustrate the key steps of the photolithography process, and the photolithography process comprises: exposing the layer (a first quantum dot layer 103 in FIG. 3-3 and FIG. 3-4, wherein the crosslinkable quantum dot for example is a green crosslinkable quantum dot sensitive to a first monochromatic light) comprising the crosslinkable quantum dot to corresponding light (to which the crosslinkable quantum dot that emits light of various color is sensitive, for example a first monochromatic light) through a mask 104 that has a contrary pattern to the light emitting sub-pixel, and then developing the exposed layer to form a pattern of a light emitting sub-pixel (such as a green light emitting sub-pixel pattern 1031).

In some embodiments, the method further comprises forming a first electrode layer corresponding to a plurality of light emitting sub-pixels on a base substrate; and forming a second electrode layer. The term "a first electrode layer corresponding to a plurality of light emitting sub-pixels" herein means that the first electrode layer has a plurality of portions, and each portion separately corresponds to one of the light emitting sub-pixels. Similar expressions would have similar meanings.

In some embodiments, the crosslinkable quantum dot is sensitive to a monochromatic light, and the photolithography process is as follows. Through a mask that has a contrary pattern to the light emitting sub-pixel, the layer comprising the crosslinkable quantum dot is exposed to a light to which the crosslinkable quantum dot is sensitive, and then developed to form a pattern of a light emitting sub-pixel.

In some embodiments, the crosslinkable quantum dot comprises a green light quantum dot sensitive to a first monochromatic light, and the step A comprises exposing the layer comprising the crosslinkable quantum dot to a first monochromatic light through a first mask that has a contrary pattern to the green light emitting sub-pixel. Such exposure allows the green light quantum dots sensitive to the first monochromatic light in the green light emitting sub-pixel region to react and form a cross-linked network.

In some embodiments, the crosslinkable quantum dot comprises a blue light quantum dot sensitive to a second monochromatic light, and the step A comprises exposing the layer comprising the crosslinkable quantum dot to a second monochromatic light through a second mask that has a contrary pattern to the blue light emitting sub-pixel. Such exposure allows the blue light quantum dots sensitive to the second monochromatic light in the blue light emitting sub-pixel region to react and form a cross-linked network.

In some embodiments, the crosslinkable quantum dot comprises a red light quantum dot sensitive to a third monochromatic light, and the step A comprises exposing the layer comprising the crosslinkable quantum dot to a third monochromatic light through a third mask that has a contrary pattern to the red light emitting sub-pixel. Such exposure allows the red light quantum dots sensitive to the third monochromatic light in the red light emitting sub-pixel region to react and form a cross-linked network.

In some embodiments, the first monochromatic light, the second monochromatic light and the third monochromatic light are different from each other. Such difference of the first monochromatic light, the second monochromatic light and the third monochromatic light can avoid undesired crosslinking of another kind of crosslinkable quantum dot during crosslinking a kind of crosslinkable quantum dot. Therefore, crosslinkable quantum dots of two or more kinds of colors may be applied once for all, and subjected to multiple exposures and a single development, thereby forming a light emitting sub-pixel pattern of two or more kinds of colors accordingly.

In some embodiments, the first monochromatic light is I-line; the second monochromatic light is G-line and the third monochromatic light is H-line. In the present disclosure, I-line means light with a wavelength of 365±10 nm (for example 365 nm); G-line means light with a wavelength of 436±10 nm (for example 436 nm); H-line means light with a wavelength of 405±10 nm (for example 405 nm).

At least one embodiment of the present disclosure further provides another method for preparing an array substrate or a display panel or a display device, and the method comprises at least one of the following operations:

forming a first quantum dot layer comprising the crosslinkable quantum dot on a base substrate wherein the crosslinkable quantum dot comprises a green light quantum dot sensitive to a first monochromatic light, exposing the layer to the first monochromatic light through a first mask that has a contrary pattern to a green light emitting sub-pixel, and then developing the exposed layer to form a green light emitting sub-pixel pattern;

forming a second quantum dot layer comprising the crosslinkable quantum dot on a base substrate wherein the crosslinkable quantum dot comprises a blue light quantum dot sensitive to a second monochromatic light, exposing the layer to the second monochromatic light through a second mask that has a contrary pattern to a blue light emitting sub-pixel, and then developing the exposed layer to form a blue light emitting sub-pixel pattern; and forming a third quantum dot layer comprising the crosslinkable quantum dot on a base substrate wherein the crosslinkable quantum dot comprises a red light quantum dot sensitive to a third monochromatic light, exposing the layer to the third monochromatic light through a third mask that has a contrary pattern to a red light emitting sub-pixel, and then developing the exposed layer to form a red light emitting sub-pixel pattern.

In this method, the first monochromatic light, the second monochromatic light and the third monochromatic light can be the same (for example, all of them are ultraviolet) or not.

At least one embodiment of the present disclosure provide a method for preparing an array substrate or a display panel or a display device, and the method comprises:

forming a first electrode layer corresponding to a plurality of light emitting sub-pixels on a base substrate;

forming a layer comprising a crosslinkable quantum dot and preparing a quantum dot light-emitting layer corresponding to a plurality of light emitting sub-pixels through a photolithography process; and forming a second electrode layer, wherein the quantum dot light-emitting layer comprises a cross-linked network formed by crosslinking the crosslinkable quantum dots.

In some embodiments, the first electrode is an anode; the second electrode is a cathode; each of the light emitting sub-pixels further comprises a hole injection layer and a hole transporting layer arranged between the first electrode and the quantum dot light-emitting layer; the light emitting sub-pixels also comprise an electron injection layer and an electron transporting layer arranged between the second electrode and the quantum dot light-emitting layer.

In some embodiments, the first electrode is a cathode; the second electrode is an anode; each of the light emitting sub-pixels further comprises a hole injection layer and a hole transporting layer arranged between the second electrode and the quantum dot light-emitting layer; the light emitting sub-pixels also comprise an electron injection layer and an electron transporting layer arranged between the first electrode and the quantum dot light-emitting layer.

EMBODIMENTS

Embodiments of the present disclosure use the following materials. All of the materials are conventional, and may be prepared by general methods or purchased from the market.

TABLE 1

Sources and Properties of Raw Materials

| Raw Materials | Sources | Property (surface groups) |
|---|---|---|
| green quantum dot material | Guangdong Pujiafu Photoelectric Technology Co., LTD | CdSe/ZnS, oleic acid/oleylamin ligand |
| blue quantum dot material | Guangdong Pujiafu Photoelectric Technology Co., LTD | CdSe/ZnS, oleic acid/oleylamin ligand |
| red quantum dot material | Guangdong Pujiafu Photoelectric Technology Co., LTD | CdSe/ZnS, oleic acid/oleylamin ligand |
| pyridine | www.aladdin-e.com | |
| crosslinking ligand material with group R1 | www.aladdin-e.com | mercaptoacetic acid |
| crosslinking ligand material with group R1 | www.aladdin-e.com | 1-cyclohexene-1-acetic acid |
| crosslinking ligand material with group R3 | www.aladdin-e.com | mercaptoacetic acid or 1-cyclohexene-1-acetic acid |

First Embodiment

The present embodiment relates to a method for preparing crosslinkable quantum dots of different colors.

Using a green quantum dot material to prepare a green crosslinkable quantum dot:

The green quantum dot material (its trade name is Green Quantum Dot, purchased from Guangdong Pujiafu Photoelectric Technology Co., LTD; the quantum dot material is prepared in a traditional hot injection method, and its ligand comprises tri-n-octylphosphine, tri-n-octylphosphine oxide, oleylamine and oleic acid, etc.) is kept in contact with pyridine at a weight ratio of 1:5 under stirring at ambient conditions for 2 hours to replace the ligand of the quantum dot material with pyridine. Then the quantum dot having pyridine is separated by a centrifugal method. Next, the quantum dot having pyridine and a crosslinking ligand material having double functional groups (mercaptoacetic acid and 1-cyclohexene-1-acetic acid, purchased from www.aladdin-e.com) are reacted to replace pyridine with the ligand having double functional groups, thereby obtaining a green crosslinkable quantum dot having double functional groups. A cross-linked network can be formed by a "click reaction" of the green crosslinkable quantum dots having double functional groups under ultraviolet.

Similarly, using a blue quantum dot material to prepare a blue crosslinkable quantum dot:

The blue quantum dot material (its trade name is Blue Quantum Dot, purchased from Guangdong Pujiafu Photoelectric Technology Co., LTD; the quantum dot material is prepared in a traditional hot injection method, and its ligand comprises tri-n-octylphosphine, tri-n-octylphosphine oxide, oleylamine and oleic acid, etc.) is kept in contact with pyridine at a weight ratio of 1:5 under stirring at ambient conditions for 2 hours to replace the ligand of the quantum dot material with pyridine. Then the quantum dot having pyridine is separated by a centrifugal method. Next, the quantum dot having pyridine and a crosslinking ligand material having double functional groups (mercaptoacetic acid and 1-cyclohexene-1-acetic acid, purchased from www.aladdin-e.com) are reacted to replace pyridine with the ligand having double functional groups, thereby obtaining a blue crosslinkable quantum dot having double functional groups. A cross-linked network can be formed by a "click reaction" of the blue crosslinkable quantum dots having double functional groups under ultraviolet.

Similarly, using a red quantum dot material to prepare a red crosslinkable quantum dot:

The red quantum dot material (its trade name is Red Quantum Dot, purchased from Guangdong Pujiafu Photoelectric Technology Co., LTD; the quantum dot material is prepared in a traditional hot injection method, and its ligand comprises tri-n-octylphosphine, tri-n-octylphosphine oxide, oleylamine and oleic acid, etc.) is kept in contact with pyridine at a weight ratio of 1:5 under stirring at ambient conditions for 2 hours to replace the ligand of the quantum dot material with pyridine. Then the quantum dot having pyridine is separated by a centrifugal method. Next, the quantum dot having pyridine and a crosslinking ligand material having double functional groups (mercaptoacetic acid and 1-cyclohexene-1-acetic acid, purchased from www.aladdin-e.com) are reacted to replace pyridine with the ligand having double functional groups, thereby obtaining a red crosslinkable quantum dot having double functional groups. A cross-linked network can be formed by a "click reaction" of the red crosslinkable quantum dots having double functional groups under ultraviolet.

There is no restrictions on the quantum dot in the embodiment, it may be a quantum dot that emits light of various color, and the quantum dot may be selected from CdS, CdSe, ZnSe, InP, PbS, $CsPbCl_3$, $CsPbBr_3$, $CsPhI_3$, CdS/ZnS, CdSe/ZnS, ZnSe, InP/ZnS, PbS/ZnS, $CsPbCl_3$/ZnS, $CsPbBr_3$/ZnS, $CsPhI_3$/ZnS, etc.

Double functional groups (a pair of R1/R2) may be a pair of functional groups that can be subjected to "click" reaction initiated by ultraviolet, for example, mercapto/alkenyl, mercapto/dialkylene, mercapto/alkynyl, mercapto/dialkynyl, alkenyl/alkenyl, alkenyl/dialkylene. Both R1 and R2 may be double unsaturated functional groups (such as dialkylene/dialkylene) for example, isoprene, which can be subjected to a crosslinking reaction under light.

Second Embodiment

The present embodiment discloses a method for preparing a mono-functional crosslinkable quantum dot of various colors. The method is similar to the first embodiment.

A quantum dot material (for example, the quantum dot material used in the first embodiment, such as the green quantum dot material, the blue quantum dot material and the red quantum dot material) is kept in contact with pyridine at a weight ratio of 1:5 under stirring at ambient conditions for 2 hours to replace the ligand of the quantum dot material with pyridine. Then the quantum dot having pyridine is separated by a centrifugal method. Next, the quantum dot having pyridine and a crosslinking ligand material having mono-functional group (mercaptoacetic acid, purchased from www.aladdin-e.com) are reacted to replace pyridine with the ligand having a mono-functional group, thereby obtaining a crosslinkable quantum dot having a mono-functional group. When the crosslinkable quantum dot having a mono-functional group is used, it is mixed with a crosslinking agent (1,7-octadiene or 1,9-octadiyne).

There is no restrictions on the quantum dot in the embodiment, it may be a quantum dot that emits light of various color, and the quantum dot may be selected from CdS, CdSe, ZnSe, InP, PbS, $CsPbCl_3$, $CsPbBr_3$, $CsPhI_3$, CdS/ZnS, CdSe/ZnS, ZnSe, InP/ZnS, PbS/ZnS, $CsPbCl_3$/ZnS, $CsPbBr_3$/ZnS, $CsPhI_3$/ZnS, etc.

In the present embodiment, the functional group R3 is mercapto; and the corresponding crosslinking agent may be 1,7-octadiene or 1,9-octadiyne. Alternatively, R3 may be an unsaturated group such as alkenyl and prenyl, and the corresponding crosslinking agent may be compounds having isoprene groups, or ligands having other double functional groups or compounds having multiple functional groups.

Third Embodiment

The present embodiment provides a method for preparing a green crosslinkable quantum dot sensitive to I-line.

The green quantum dot material (its trade name is Green Quantum Dot, purchased from Guangdong Pujiafu Photoelectric Technology Co., LTD, the quantum dot material is prepared in a traditional hot injection method, and its ligand comprises tri-n-octylphosphine, tri-n-octylphosphine oxide, oleylamine and oleic acid, etc.) is kept in contact with pyridine at a weight ratio of 1:5 under stirring at ambient conditions for 2 hours to replace the ligand of the quantum dot material with pyridine. Then the quantum dot having pyridine is separated by a centrifugal method. Next, the quantum dot having pyridine and a crosslinking ligand material having two functional groups (for example, tert-butoxycarbonyl protected C-methyl calixarene [4] and diphenyliodanium 9,10-dimethoxyanthracene-2-sulfonate having carboxyl) are reacted to replace pyridine with the ligand having two functional groups, thereby obtaining a crosslinkable quantum dot having two functional groups which is sensitive to I-line.

Fourth Embodiment

The present embodiment provides a method for preparing a blue crosslinkable quantum dot sensitive to G-line.

The blue quantum dot material (its trade name is Blue Quantum Dot, purchased from Guangdong Pujiafu Photoelectric Technology Co., LTD, the quantum dot material is prepared in a traditional hot injection method, and its ligand comprises tri-n-octylphosphine, tri-n-octylphosphine oxide, oleylamine and oleic acid, etc.) is kept in contact with pyridine at a weight ratio of 1:5 under stirring at ambient conditions for 2 hours to replace the ligand of the quantum dot material with pyridine. Then the quantum dot having pyridine is separated by a centrifugal method. Next, the quantum dot having pyridine and a crosslinking ligand material having two functional groups (for example, G novolak and diazonaphthoquinone having carboxyl) are reacted to replace pyridine with the ligand having two functional groups, thereby obtaining a crosslinkable quantum dot having two functional groups which is sensitive to G-line.

Fifth Embodiment

The present embodiment provides a method for preparing a red crosslinkable quantum dot sensitive to H-line.

The red quantum dot material (its trade name is Red Quantum Dot, purchased from Guangdong Pujiafu Photoelectric Technology Co., LTD, the quantum dot material is prepared in a traditional hot injection method, and its ligand comprises tri-n-octylphosphine, tri-n-octylphosphine oxide, oleylamine and oleic acid, etc.) is kept in contact with pyridine at a weight ratio of 1:5 under stirring at ambient conditions for 2 hours to replace the ligand of the quantum dot material with pyridine. Then the quantum dot having pyridine is separated by a centrifugal method. Next, the quantum dot having pyridine and a crosslinking ligand material having two functional groups (for example, H novolak and diazonaphthoquinone having carboxyl) are reacted to replace pyridine with the ligand having two functional groups, thereby obtaining a crosslinkable quantum dot having two functional groups which is sensitive to H-line.

Sixth Embodiment

Figure 311:
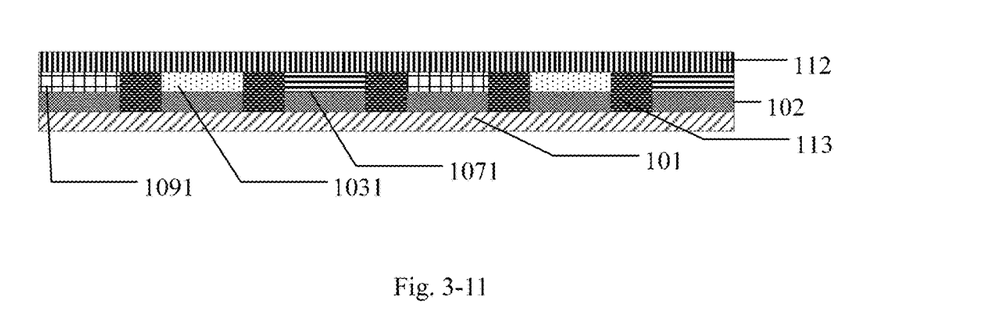

The present embodiment provides an array substrate firstly, as illustrated in FIG. 3-11, and the array substrate comprises a base substrate (101) and a plurality of light emitting sub-pixels arranged on the base substrate (101). Each of the light emitting sub-pixels comprises a first electrode (102), a quantum dot light-emitting layer (1031, 1071, 1091) and a second electrode (112) which are arranged sequentially on the base substrate. The quantum dot light-emitting layer comprises a cross-linked network formed by at least one of the crosslinkable quantum dots obtained in Embodiments 1 and 2. In the present disclosure, the term "a cross-linked network" means a cross-linked network whose center is a quantum dot inorganic core and which is formed by crosslinking the crosslinkable quantum dots.

The present embodiment further provides a method for preparing an array substrate, and the method comprises:

forming a layer comprising a crosslinkable quantum dot according to any one of the first embodiment and the second embodiment on a base substrate, and preparing a quantum dot light-emitting layer corresponding to a plurality of light emitting sub-pixels through a photolithography process, wherein the quantum dot light-emitting layer comprises a cross-linked network formed by the crosslinkable quantum dots.

For example, the method further comprises forming a switch element corresponding to a plurality of light emitting sub-pixels, a first electrode layer and a second electrode layer on the base substrate.

In some embodiments, the first electrode is an anode, and the second electrode is a cathode. In some embodiments, the first electrode is a cathode, and the second electrode is an anode.

For example, the crosslinkable quantum dot is sensitive to ultraviolet.

For example, as illustrated in FIG. 3-1 to FIG. 3-11, red crosslinkable quantum dots, green crosslinkable quantum dots and blue crosslinkable quantum dots are subjected to a photolithography process respectively to form a pattern of sub-pixels.

Figure 31:
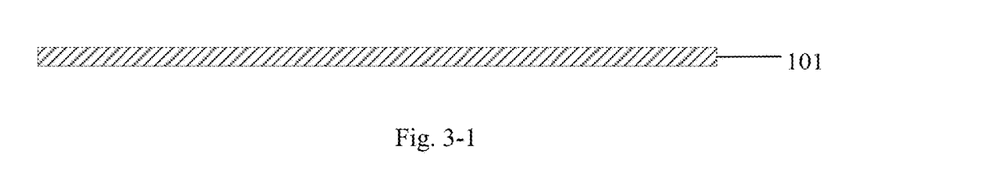
Figure 32:
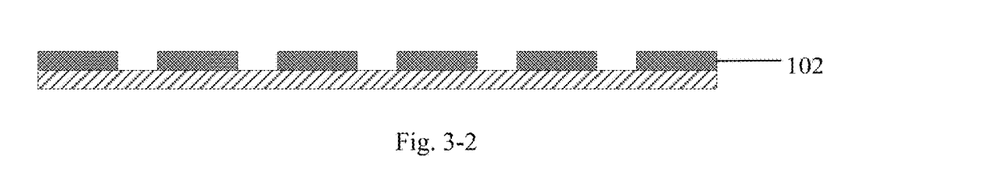

FIG. 3-1 shows a base substrate 101. FIG. 3-2 is a schematic diagram of forming a first electrode 102 on the base substrate 101. There is no special restriction on the method for forming the first electrode 102 in the present disclosure. A metal layer may be deposited on the substrate, and then the metal layer may be subjected to a photolithography process to form the first electrode 102 corresponding to each pixel. It should be noted that a switch element such as a thin film transistor (TFT) is generally formed on the substrate before forming the first electrode.

FIG. 3-3 to FIG. 3-5 show a flow chart for preparing a green light emitting sub-pixel pattern, wherein the crosslinkable quantum dot is a green quantum dot sensitive to ultraviolet 125. The green quantum dot is applied (optionally together with a photoresist, such as a negative photoresist) onto the base substrate to form a first quantum dot layer 103 (FIG. 3-3). The layer comprising the green crosslinkable quantum dot (i.e., the first quantum dot layer 103) is exposed to ultraviolet 125 through a first mask 104 that has a contrary pattern to a green light emitting sub-pixel (FIG. 3-4), and then is developed to form a green light emitting sub-pixel pattern 1031 (FIG. 3-5).

Figure 36:
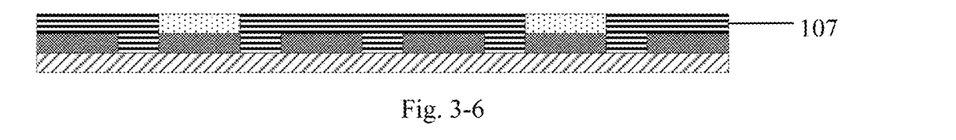
Figure 37:
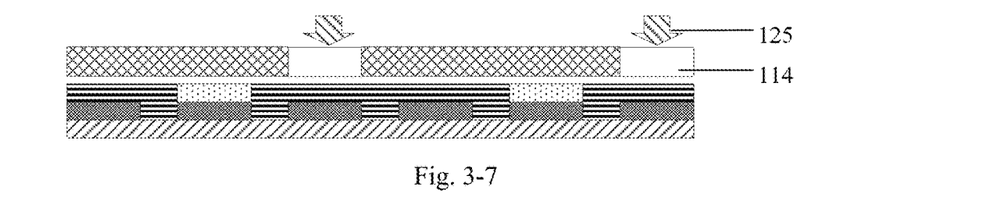
Figure 38:
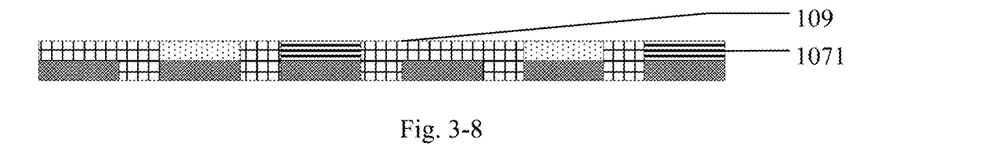

FIG. 3-6 to FIG. 3-8 show a flow chart for preparing a blue light emitting sub-pixel pattern. The blue quantum dot is applied (optionally together with a photoresist, such as a negative photoresist) onto the base substrate to form a second quantum dot layer 107 (FIG. 3-6). The layer comprising the blue crosslinkable quantum dot (i.e., the second quantum dot layer 107) is exposed to ultraviolet 125 through a second mask 114 that has a contrary pattern to a blue light emitting sub-pixel (FIG. 3-7), and then is developed to form a blue light emitting sub-pixel pattern 1071 (FIG. 3-8).

Figure 39:
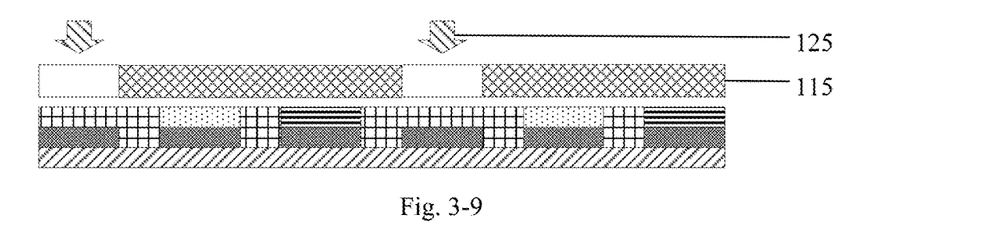
Figure 310:
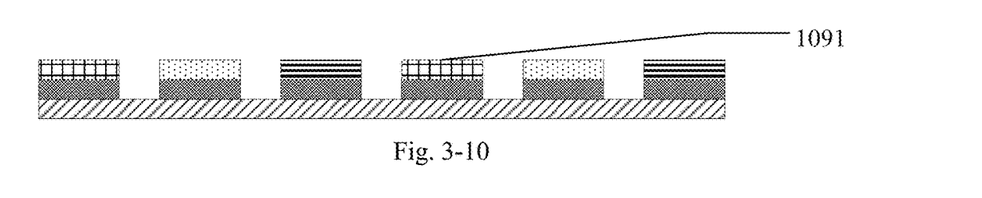

FIG. 3-9 to FIG. 3-10 show a flow chart for preparing a red light emitting sub-pixel pattern. The red quantum dot is applied (optionally together with a photoresist, such as a negative photoresist) onto the base substrate to form a third quantum dot layer 109. The layer comprising the red crosslinkable quantum dot (i.e., the third quantum dot layer 109) is exposed to ultraviolet 125 through a third mask 115 that has a contrary pattern to a red light emitting sub-pixel (FIG. 3-9), and then is developed to form a red light emitting sub-pixel pattern 1091 (FIG. 3-10). FIG. 3-10 is a schematic cross-sectional structure diagram of the array substrate shown in FIG. 5 along line A-A.

FIG. 3-11 is a schematic diagram of placing an insulating material 113 in unfilled regions and forming a cathode 112 on the light emitting sub-pixel pattern.

In the present embodiment, ultraviolet exposure leads to a crosslinking reaction of the croslinkable quantum dots.

It should be noted that one or two of the green light emitting sub-pixel pattern 1031, the blue light emitting sub-pixel pattern 1071 and the red light emitting sub-pixel pattern 1091 on the array substrate may be formed from the crosslinkable quantum dots. In this case, the method for preparing the array substrate may only comprise one or two processes for preparing the green light emitting sub-pixel pattern 1031, the blue light emitting sub-pixel pattern 1071 and the red light emitting sub-pixel pattern 1091. It should be noted that some operations may be omitted or added according to different constitutions of the fabricated array substrate or according to requirements.

The following is an embodiment of the present disclosure.

A display panel comprises: a base, a TFT array substrate, a hole common layer, red, green and blue quantum dot sub-pixels, an electron common layer, a cathode, an encapsulation material and an upper polarizer.

The method for preparing the display panel is as follows. A transparent base is cleaned in a standard method, then the following operations are carried out sequentially: depositing a gate metal Mo with a thickness of 200 nm and patterning the gate metal Mo; depositing a gate medium $SiO_2$ with a thickness of 150 nm; depositing an active layer IGZO with a thickness of 40 nm and patterning it; depositing a source/drain metal Mo with a thickness of 200 nm and patterning the source/drain metal Mo; depositing a passivation layer of $SiO_2$ with a thickness of 300 nm and patterning it; depositing a pixel electrode ITO with a thickness of 40 nm and patterning it; and finally spin coating an acrylic acid material, performing a photolithography process, and curing to form a pixel definition layer with a thickness of about 1.5 micrometer and form a back portion of TFT.

Before preparing a QD-LED, the back of TFT is treated by plasma. Then the hole injection layer and the hole transporting layer are formed through a spin-coating process (for example, Poly(3,4-ethylenedioxythiophene)/Poly(styrenesulfonate) (PEDOT/PSS) and Poly[(9,9-dioctylfluorenyl-2,7-diyl)-co-(4,4'-(N-(4-sec-butylphenyl)diphenylamine)] (TFB) may be applied by spin-coating separately) with a whole thickness of 50 nm to 100 nm. Then a quantum dot material which is sensitive to green light is applied, and exposed to ultraviolet through a first mask, and then developed and fixed to form a green light sub-pixel; a quantum dot material which is sensitive to blue light is applied, and exposed to ultraviolet through a second mask, and then developed and fixed to form a blue light sub-pixel; a quantum dot material which is sensitive to red light is applied, and exposed to ultraviolet through a third mask, and then developed and fixed to form a red light sub-pixel. Then the second common layers, i.e., the electron transporting layer and the electron injection layer, are formed by spin-coating or evaporation of for example ZnO nanoparticles or LiF. Then a cathode is formed by evaporation of a metal layer for example LiF:Al layer, and the cathode has a thickness of about 500 nm to 1000 nm. After evaporating, it is encapsulated and cut to obtain the whole AM-QD-LED display panel.

The light emitting mode of the AM-QD-LED display panel is bottom emitting. The minimal size of the sub-pixels prepared can range from 10 micrometer to 30 micrometer, and the resolution is about 300-800 ppi.

The process method for preparing a QD-LED sub-pixel through a photolithography process comprises using crosslinkable or photosensitive quantum dot material to form a red light emitting sub-pixel, a green light emitting sub-pixel or a blue light emitting sub-pixel directly through the photolithography process. This process method avoids the technical difficulties in such as reducing line width for an OLED evaporation mask in a mask process and acquiring a higher precision print nozzle, which can effectively realize the manufacture of AM-QD-LED products with a high resolution. This process method is technically convenient, and enhances the qualified rate, and greatly improves the utilization rate of quantum dots, and thus paves a way for massive production of AM-QD-LED.

Seventh Embodiment

The present embodiment provides an array substrate firstly, as illustrated in FIG. 3-11, and the array substrate comprises a base substrate (101) and a plurality of light emitting sub-pixels arranged on the base substrate (101). Each of the light emitting sub-pixels comprises a first electrode (102), a quantum dot light-emitting layer (1031, 1071, 1091) and a second electrode (112) which are arranged sequentially on the base substrate. The quantum dot light-emitting layer comprises a cross-linked network formed by at least one of the crosslinkable quantum dots obtained in Embodiments 3, 4 and 5. In the present disclosure, the term "a cross-linked network" means a cross-linked network whose center is a quantum dot inorganic core and which is formed by crosslinking the crosslinkable quantum dots.

The present embodiment further provides another method for preparing an array substrate. In the method, as illustrated in FIG. 4-1 to FIG. 4-7, red crosslinkable quantum dots, green crosslinkable quantum dots and blue crosslinkable quantum dots are applied once for all, and exposed to light separately, and then developed to form a pattern of light emitting sub-pixels corresponding to the three colors. The method will be described as follows.

Figure 41:
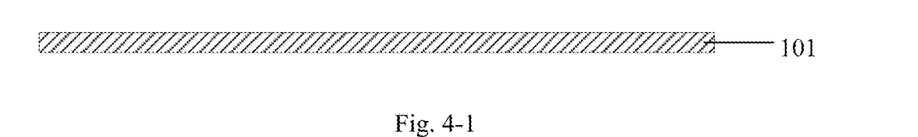
Figure 42:
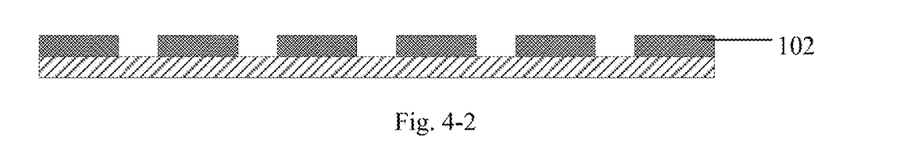

FIG. 4-1 shows a base substrate 101. FIG. 4-2 is a schematic diagram of forming a first electrode 102 on the base substrate 101. There is no special restriction on the method for forming the first electrode 102 in the present disclosure. A metal layer may be deposited on the substrate, and then the metal layer may be subjected to a photolithography process to form the first electrode 102 corresponding to each pixel. It should be noted that a switch element such as a thin film transistor (TFT) is generally formed on the substrate before forming the first electrode.

Figure 43:
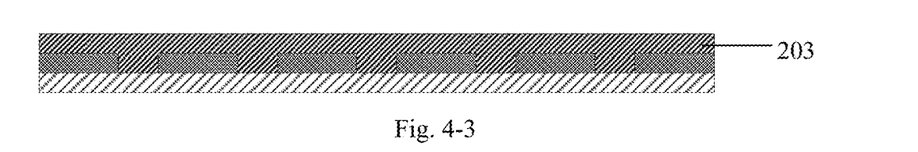

FIG. 4-3 is a schematic diagram of applying red crosslinkable quantum dots, green crosslinkable quantum dots and blue crosslinkable quantum dots, wherein the green crosslinkable quantum dots are sensitive to a first monochromatic light (such as an I-line), and the blue crosslinkable quantum dots sensitive to a second monochromatic light (such as a G-line), and the red crosslinkable quantum dots sensitive to a third monochromatic light (such as an H-line). The red crosslinkable quantum dots, the green crosslinkable quantum dots, and the blue crosslinkable quantum dots are mixed optionally with a photoresist (such as negative photoresist) and then applied on a base substrate 101 to form a fourth quantum dot layer 203.

Figure 44:
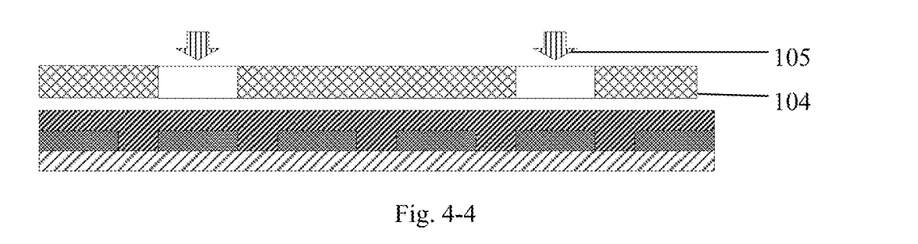

FIG. 4-4 is a schematic diagram of exposing the green crosslinkable quantum dots in the region of the green light emitting sub-pixel pattern 1031 as illustrated in FIG. 4-7 to a first monochromatic light 105. For example, the layer comprising the green crosslinkable quantum dots, the blue crosslinkable quantum dots and the red crosslinkable quantum dots (i.e., a fourth quantum dot layer 203) is exposed to a first monochromatic light 105 through a fourth mask 104 that has a contrary pattern to the green light emitting sub-pixel. Such exposure results in crosslinking only the green crosslinkable quantum dots in the region of the green light emitting sub-pixel pattern 1031.

Figure 45:
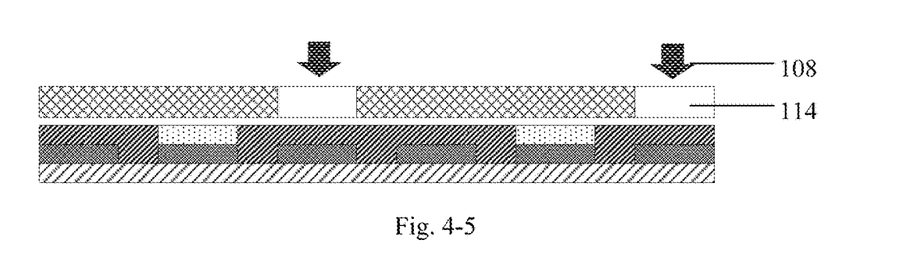

FIG. 4-5 is a schematic diagram of exposing the blue crosslinkable quantum dots in the region of the blue light emitting sub-pixel pattern 1071 as illustrated in FIG. 4-7 to a second monochromatic light 108. For example, the layer comprising the green crosslinkable quantum dots, the blue crosslinkable quantum dots and the red crosslinkable quantum dots (i.e., a fourth quantum dot layer 203) is exposed to a second monochromatic light 108 through a fifth mask 114 that has a contrary pattern to the blue light emitting sub-pixel. Such exposure results in crosslinking only the blue crosslinkable quantum dots in the region of the blue light emitting sub-pixel pattern 1071.

FIG. 4-6 is a schematic diagram of exposing the red crosslinkable quantum dots in the region of the red light emitting sub-pixel pattern 1091 as illustrated in FIG. 4-7 to a third monochromatic light 110. For example, the layer comprising the green crosslinkable quantum dots, the blue crosslinkable quantum dots and the red crosslinkable quantum dots (i.e., a fourth quantum dot layer 203) is exposed to a third monochromatic light 110 through a sixth mask 115 that has a contrary pattern to the red light emitting sub-pixel. Such exposure results in crosslinking only the red crosslinkable quantum dots in the region of the red light emitting sub-pixel pattern 1091.

FIG. 4-7 is a schematic diagram of developing the exposed fourth quantum dot layer 203 to form a green light emitting sub-pixel pattern 1031, a blue light emitting sub-pixel pattern 1071 and a red light emitting sub-pixel pattern 1091. The developing process may comprise rinsing the fourth quantum dot layer 203 to wash off un-crosslinked quantum dots and reveal the sub-pixel pattern of various colors.

Afterwards, an insulating material 113 is placed in unfilled regions and a cathode 112 is formed on the light emitting sub-pixel pattern, thereby obtaining an array substrate as illustrated in FIG. 3-11.

In the present embodiment, the first monochromatic light 105, the second monochromatic light 108 and the third monochromatic light 110 are different from each other.

It should be noted that, one or two of the green light emitting sub-pixel pattern 1031, the blue light emitting sub-pixel pattern 1071 and the red light emitting sub-pixel pattern 1091 on the array substrate may be formed from the crosslinkable quantum dots. In this case, the method for preparing the array substrate may comprise forming a mixture of two of the red crosslinkable quantum dot, the green crosslinkable quantum dot and the blue crosslinkable quantum dot and optionally a photoresist, and exposing the mixture to two kinds of the corresponding monochromatic light. Therefore, two kinds of light emitting sub-pixel patterns are prepared through a single coating and two exposures. In this case, a light emitting sub-pixel pattern of the color other than these two colors may be fabricated by a method in fifth embodiment or by other methods known in the field. It should be noted that some operations may be omitted or added according to different constitutions of the fabricated array substrate or according to requirements.

In some embodiments, each of the light emitting sub-pixels further comprises a thin film transistor formed on the base substrate. A first electrode is arranged on the thin film transistor, and electrically connects with drain electrode of the thin film transistor.

In some embodiments, the first electrode is an anode, and the second electrode is a cathode. In some embodiments, the first electrode is a cathode, and the second electrode is an anode.

In some embodiments, each of the light emitting sub-pixels further comprises a hole injection layer and a hole transporting layer arranged between anode and the quantum dot light-emitting layer. The hole injection layer and the hole transporting layer may be an organic layer with a same thickness or not.

In some embodiments, the light emitting sub-pixel further comprises an electron injection layer and an electron transporting layer arranged between cathode and the quantum dot light-emitting layer.

The following is an embodiment of the present disclosure.

A display panel comprises: a base, a TFT array substrate, a hole common layer, red, green and blue quantum dot sub-pixels, an electron common layer, a cathode, an encapsulation material and an upper polarizer.

The method for preparing the display panel is as follows.

A transparent base is cleaned in a standard method, then the following operations are carried out sequentially: depositing a gate metal Mo with a thickness of 200 nm and patterning the gate metal Mo; depositing a gate medium $SiO_2$ with a thickness of 150 nm; depositing an active layer LTPS with a thickness of 40 nm and patterning it; depositing a source/drain metal Mo with a thickness of 200 nm and patterning the source/drain metal Mo; depositing a passivation layer of $SiO_2$ with a thickness of 300 nm and patterning it; depositing a pixel electrode ITO with a thickness of 40 nm and patterning it; finally spin coating an acrylic acid material, performing a photolithography process, and curing to form a pixel definition layer with a thickness of about 1.5 micrometer and form a back portion of TFT.

Before preparing a QD-LED, the back of TFT is treated by plasma. Then an electron injection layer and an electron transporting layer are formed through an evaporation, spin coating or sputtering process (for example, evaporating LiF:Al separately, spin coating or sputtering ZnO layer, etc.) with a whole thickness of 50 nm to 100 nm. Then a mixture comprising the green light-sensitive quantum dot material, the blue light-sensitive quantum dot material and the red light-sensitive quantum dot material is applied, and the whole is exposed to I-line through a first mask, resulting in an exposure of the region of the green light sub-pixel. The whole is then exposed to G-line through a second mask, resulting in an exposure of the region of the blue light sub-pixel. The whole is finally exposed to H-line through a third mask, resulting in an exposure of the region of the red light sub-pixel. Then the whole is developed and fixed to form a green light sub-pixel pattern, a blue light sub-pixel pattern and a red light sub-pixel pattern. Then the second common layers i.e., the hole transporting layer and the hole injection layer are formed by spin coating or evaporating for example, TFB (Poly[(9,9-dioctylfluorenyl-2,7-diyl)-co-(4, 4'-(N-(4-sec-butylphenyl) diphenylamine)]) and PEDOT/PSS (Poly (3,4-ethylendioxythiophene)-Poly (styrene sulfonic acid)). Then an anode is formed by evaporation of a metal layer for example Al, Ag or Al/ITO layer, and the anode has a thickness of about 30 nm to 100 nm. After evaporating, it is encapsulated by Dam & Fritz method and cut to obtain the whole AM-QD-LED display panel.

The AM-QD-LED device adopts an inverted structure, and the light emitting mode of the display panel is top emitting. The minimal size of the sub-pixels prepared can range from 10 to 30 micrometers, and the resolution is about 300-800 ppi.

In the method of the present embodiment, light emitting sub-pixels of colors are formed by a single application of quantum dots of different colors on a base substrate, multiple exposures and a single development. In addition to the advantages in the fifth embodiment, this method may further simplify the process and improve the manufacture efficiency.

It should be noted that, in the present embodiment, the first monochromatic light 105, the second monochromatic light 108 and the third monochromatic light 110 differs from each other, and they only act to crosslink the green light quantum dots, the blue light quantum dots and the red light quantum dots respectively.

For example, the first monochromatic light 105 is I-line (light with a wavelength of about 365 nm); the second monochromatic light 108 is G-line (light with a wavelength of about 436 nm); and the third monochromatic light 110 is H-line (light with a wavelength of about 405 nm).

The technical solutions of the present disclosure not only realize the fabrication of a QD-LED array substrate and a display panel or a display device through a photolithography process, but also obtain an array substrate having a resolution of 300-800 ppi. The method for preparing an array substrate enhances the qualified rate, and greatly improves the utilization rate of quantum dots, and thus paves a way for massive production of AM-QD-LED.

What are described above is only related to some illustrative embodiments of the present disclosure and not limitative to the scope of the present invention. The scope of the present invention is defined by the accompanying claims.

The present application claims the priority of the Chinese Patent Application No. 201610021323.8 filed on Jan. 13, 2016, which is incorporated herein by reference as part of the present application.

What is claimed is:

1. A crosslinkable quantum dot, wherein the surface of the crosslinkable quantum dot has one of:
   a pair of groups R1 and R2 capable of reacting to form a cross-linked network, or a group R3 capable of being cross-linked by a crosslinking agent to form a cross-linked network;
   wherein the group R1 is selected from at least one of alkenyl and dialkylene; the group R2 is selected from at least one of dialkylene, alkynyl and dialkynyl, so that the obtained crosslinkable quantum dot is sensitive to ultraviolet;
   wherein the group R3 is dialkylene, and the crosslinking agent is selected from at least one of C4-C20 dialkene or C4-C20 dialkyne.

2. The crosslinkable quantum dot according to claim 1, wherein a quantum dot material for preparing the crosslinkable quantum dot is selected from at least one of CdS, CdSe, ZnSe, InP, PbS, $CsPbCl_3$, $CsPbBr_3$, $CsPhI_3$, CdS/ZnS, CdSe/ZnS, ZnSe, InP/ZnS, PbS/ZnS, $CsPbCl_3$/ZnS, $CsPbBr_3$/ZnS and $CsPhI_3$/ZnS.

3. A method for preparing a crosslinkable quantum dot, which comprises:
   step 1: bringing a quantum dot material into contact with pyridine to obtain a quantum dot having pyridine on its surface; and
   step 2: bringing the quantum dot having pyridine on its surface into contact with a crosslinking ligand material to obtain the crosslinkable quantum dot, wherein the crosslinking ligand material comprises at least one of a ligand having groups R1 and R2 and a ligand having the group R3;
   wherein the group R1 is selected from at least one of mercapto, alkenyl and dialkylene; the group R2 is selected from at least one of alkenyl, dialkylene, alkynyl and dialkynyl, the group R3 is selected from at least one of mercapto, alkenyl and dialkylene, and the crosslinking agent is selected from at least one of C4-C20 dialkyne, so that the obtained crosslinkable quantum dot is sensitive to ultraviolet.

4. The method according to claim 3, wherein in step 1, the quantum dot material and pyridine at a weight ratio greater than 1:1 are kept in contact for about 5 minutes to 10 hours with stirring at room temperature and under normal pressure, and then the quantum dot having pyridine on its surface is separated by a centrifugal method.

5. The method according to claim 3, wherein the ligand having the groups R1 and R2 comprises tert-butoxycarbonyl protected C-methyl calixarene [4] and diphenyliodonium 9,10-dimethoxy anthracene-2-sulfonate having carboxyl to obtain the crosslinkable quantum dot which is sensitive to I-line.

6. An array substrate, comprising: a base substrate and a plurality of light emitting sub-pixels arranged on the base substrate, wherein
   each of the light emitting sub-pixels comprises a first electrode, a quantum dot light-emitting layer and a second electrode which are arranged sequentially on the base substrate, and the quantum dot light-emitting layer comprises a cross-linked network formed by crosslinking the crosslinkable quantum dot of claim 1.

7. A display device, comprising the array substrate according to claim 6.

8. A method for preparing an array substrate, comprising:
   forming a layer comprising the crosslinkable quantum dot on a base substrate, wherein the surface of the crosslinkable quantum dot has one of: a pair of groups R1 and R2 capable of reacting to form a cross-linked network, or a group R3 capable of being cross-linked by a crosslinking agent to form a cross-linked network; the group R1 is selected from at least one of alkenyl and dialkylene; the group R2 is selected from at least one of dialkylene, alkynyl and dialkynyl, so that the obtained crosslinkable quantum dot is sensitive to ultraviolet the group R3 is dialkylene, the crosslinking agent is selected from at least one of C4-C20 dialkene or C4-C20 dialkyne; and
   patterning the layer to obtain a quantum dot light-emitting layer corresponding to a plurality of light emitting sub pixels, wherein the quantum dot light-emitting layer comprises the cross-linked network formed by the crosslinkable quantum dot.

9. The method according to claim 8, wherein the patterning the layer comprises:
   exposing the layer comprising the crosslinkable quantum dot through a mask, and then developing the exposed layer, thereby forming the quantum dot light-emitting layer of light emitting sub pixels.

10. The method according to claim 8, wherein
    if the crosslinkable quantum dot comprises a green light quantum dot which is sensitive to a first monochromatic light, then the layer comprising the crosslinkable quantum dot is exposed to the first monochromatic light;
    if the crosslinkable quantum dot comprises a blue light quantum dot which is sensitive to a second monochromatic light, then the layer comprising the crosslinkable quantum dot is exposed to the second monochromatic light;
    if the crosslinkable quantum dot comprises a red light quantum dot which is sensitive to a third monochromatic light, then the layer comprising the crosslinkable quantum dot is exposed to the third monochromatic light.

11. The method according to claim 8, comprises at least two of the following operations:
    forming a layer comprising the crosslinkable quantum dot on a base substrate wherein the crosslinkable quantum dot comprises a green light quantum dot sensitive to a first monochromatic light, exposing the layer to the first monochromatic light through a first mask that has a contrary pattern to a green light emitting sub-pixel, and then developing the exposed layer to form a green light emitting sub-pixel pattern;
    forming a layer comprising the crosslinkable quantum dot on a base substrate, wherein the crosslinkable quantum dot comprises a blue light quantum dot sensitive to a second monochromatic light, exposing the layer to the second monochromatic light through a second mask that has a contrary pattern to a blue light emitting sub-pixel, and then developing the exposed layer to form a blue light emitting sub-pixel pattern;

forming a layer comprising the crosslinkable quantum dot on a base substrate, wherein the crosslinkable quantum dot comprises a red light quantum dot sensitive to a third monochromatic light, exposing the layer to the third monochromatic light through a third mask that has a contrary pattern to a red light emitting sub-pixel, and then developing the exposed layer to form a red light emitting sub-pixel pattern.

12. The method according to claim 11, wherein the first monochromatic light is I-line; the second monochromatic light is G-line; and the third monochromatic light is H-line.

* * * * *